(12) United States Patent
Ishitani et al.

(10) Patent No.: US 7,805,023 B2
(45) Date of Patent: Sep. 28, 2010

(54) IMAGE EVALUATION METHOD AND MICROSCOPE

(75) Inventors: Tohru Ishitani, Hitachinaka (JP); Mitsugu Sato, Hitachinaka (JP); Hideo Todokoro, Nishitama (JP); Tadashi Otaka, Hitachinaka (JP); Takashi Iizumi, Hitachinaka (JP); Atsushi Takane, Mito (JP)

(73) Assignee: Hitachi, Ltd., Tokyo (JP)

( * ) Notice: Subject to any disclaimer, the term of this patent is extended or adjusted under 35 U.S.C. 154(b) by 273 days.

(21) Appl. No.: 11/802,262

(22) Filed: May 21, 2007

(65) Prior Publication Data
US 2007/0280559 A1 Dec. 6, 2007

Related U.S. Application Data

(63) Continuation of application No. 10/219,765, filed on Aug. 16, 2002, now Pat. No. 7,236,651.

(30) Foreign Application Priority Data

Aug. 24, 2001 (JP) ............................ 2001-253752
Mar. 8, 2002 (JP) .............................. 2002-62817

(51) Int. Cl.
*G06K 9/32* (2006.01)
*G21K 7/00* (2006.01)

(52) U.S. Cl. .................. 382/299; 250/311; 345/699

(58) Field of Classification Search ......... 382/298–299; 345/698–699; 250/310
See application file for complete search history.

(56) References Cited

U.S. PATENT DOCUMENTS

| | | | |
|---|---|---|---|
| 4,742,558 A | 5/1988 | Ishibashi et al. | |
| 5,160,931 A | 11/1992 | Brown | |
| 5,735,796 A | 4/1998 | Granz et al. | |
| 5,937,097 A | 8/1999 | Lennon et al. | |
| 6,166,380 A | 12/2000 | Kitagawa et al. | |
| 6,198,494 B1 | 3/2001 | Haraguchi et al. | |

(Continued)

FOREIGN PATENT DOCUMENTS

EP 0 877 409 A2 11/1998

(Continued)

OTHER PUBLICATIONS

G. L. Fanget et al. "Survey of Scanning Electron Microscopes Using Quantitative Resolution Evaluation," Proceedings of the Spie, Spie, vol. 3050, pp. 80-92.

(Continued)

*Primary Examiner*—Manav Seth
(74) *Attorney, Agent, or Firm*—Dickstein Shapiro LLP

(57) ABSTRACT

Image evaluation method capable of objectively evaluating the image resolution of a microscope image. An image resolution method is characterized in that resolution in partial regions of an image is obtained over an entire area of the image or a portion of the image, averaging is performed over the entire area of the image or the portion of the image, and the averaged value is established as the resolution evaluation value of the entire area of the image or the portion of the image. This method eliminates the subjective impressions of the evaluator from evaluation of microscope image resolution, so image resolution evaluation values of high accuracy and good repeatability can be obtained.

20 Claims, 9 Drawing Sheets

U.S. PATENT DOCUMENTS

| | | |
|---|---|---|
| 6,259,960 B1 | 7/2001 | Inokuchi et al. |
| 6,545,275 B1 | 4/2003 | Pearl et al. |
| 6,771,813 B1 | 8/2004 | Katsuyama et al. |
| 2003/0198399 A1 | 10/2003 | Atkins |
| 2004/0173748 A1 | 9/2004 | Dirksen et al. |

FOREIGN PATENT DOCUMENTS

| | | |
|---|---|---|
| EP | 1 081 742 A2 | 3/2001 |
| JP | 5-45265 | 2/1993 |
| JP | 8-31363 | 2/1996 |
| JP | 11-224640 | 8/1999 |
| JP | 11-257939 | 9/1999 |
| JP | 2000-067797 | 3/2000 |

OTHER PUBLICATIONS

Martin et al., New Approach in Scanning Electron Microscope Resolution Evaluation, Centre Commun CNET SSG-Thomson, BP 16/38921 Crolles/France, SPIE, vol. 2439, pp. 310-318.

Postek et al., SEM Performance Evaluation Using the Sharpness Criterion, Nano-Scale Metrology Group, National Institute of Standards and Technology, Gaithersburg, MD 20899 USA, SPIE, vol. 2725, pp. 504-514.

FIG.2A
FIG.2B
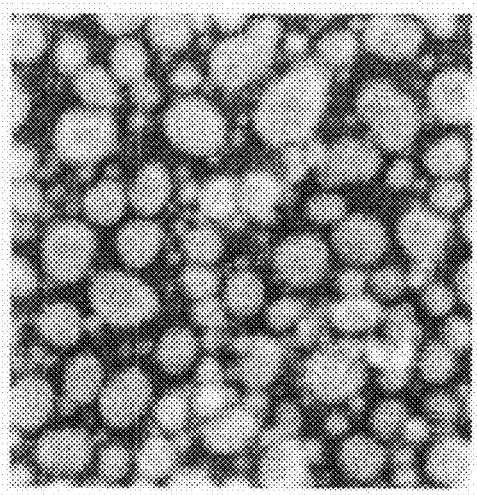
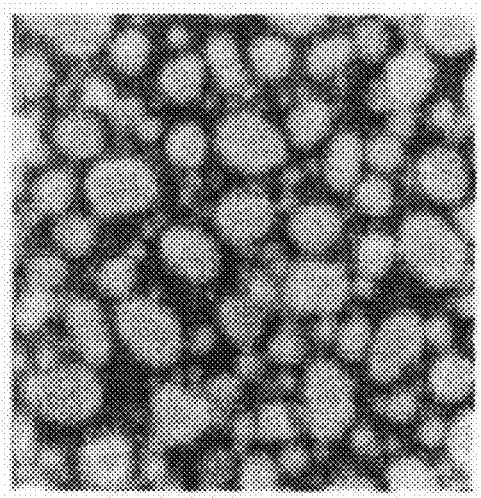
PRESENT METHOD: Rcap(b)/Rcgfar=1.29 (MULTIPLE EVALUATOR ERROR=6%)
GAP METHOD: Rcap(b)/Rgap(a)=1.87 (MULTIPLE EVALUATOR ERROR=40%)
FIG.3A
FIG.3B
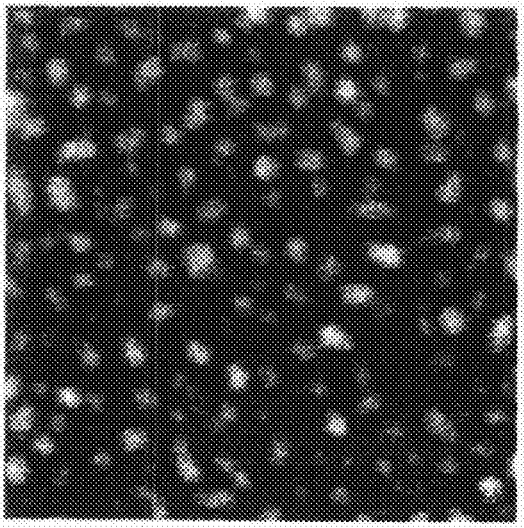
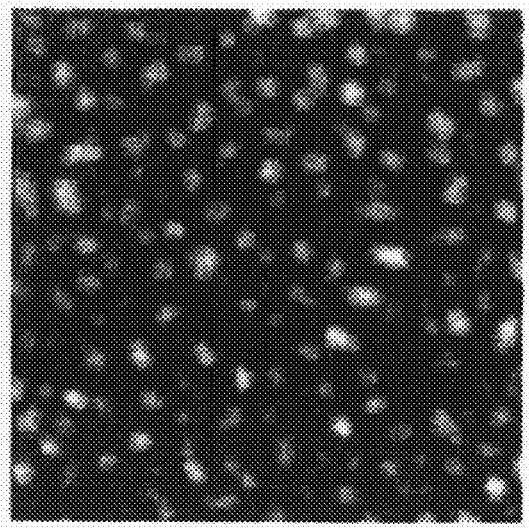

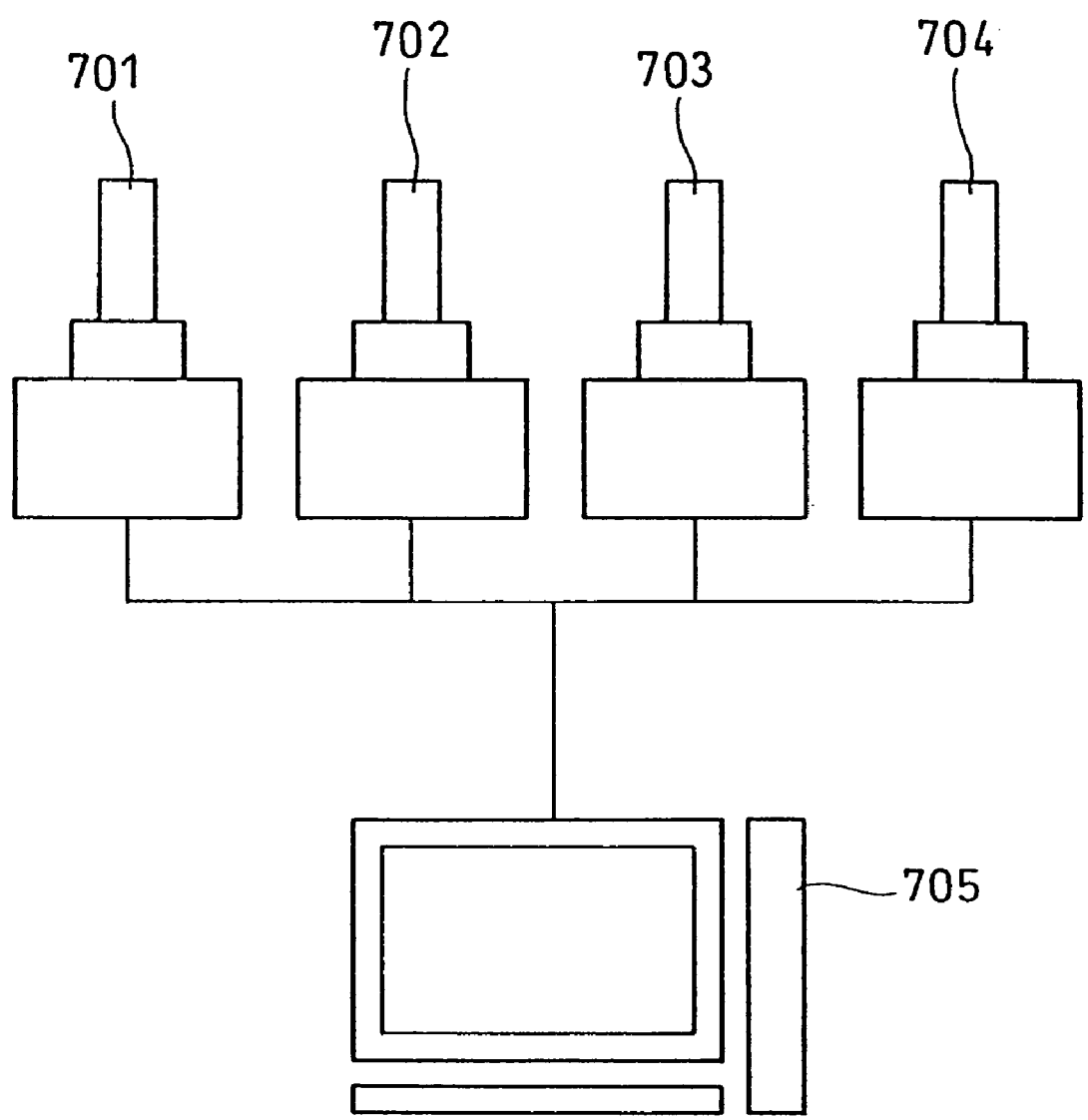

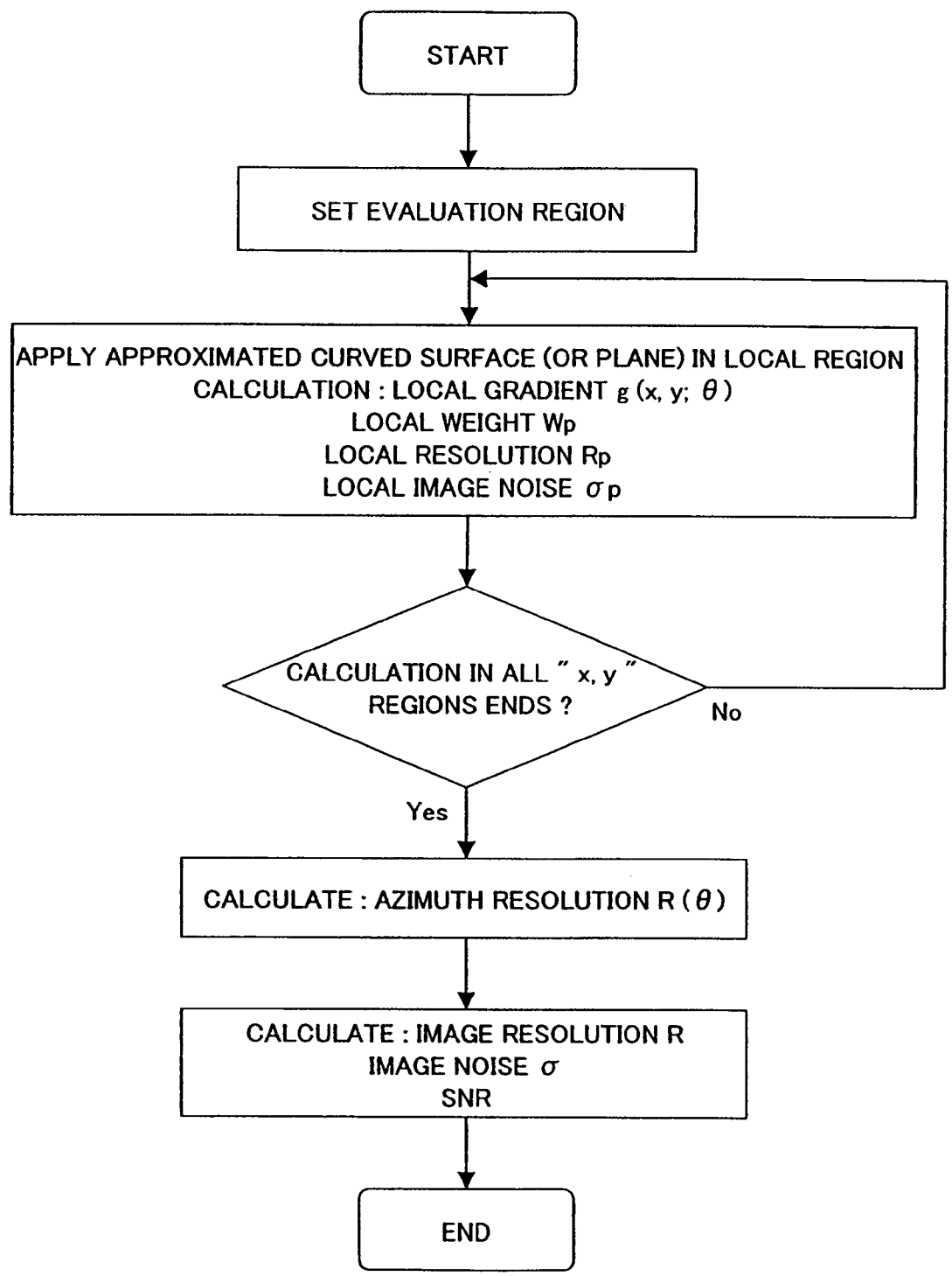

IMAGE EVALUATION METHOD AND MICROSCOPE

CROSS REFERENCE TO RELATED APPLICATIONS

The present application is a continuation of U.S. patent application Ser. No. 10/219,765, filed on Aug. 16, 2002, the entire disclosure of which is incorporated herein by reference, claiming priority on Japanese Patent Applications No. 2001-253752, filed on Aug. 24, 2001 and No. 2002-62817, filed on Mar. 8, 2002, the entire contents of which are incorporated herein by reference.

BACKGROUND OF THE INVENTION

The present invention relates to methods for evaluating microscope images such as from scanning electron microscopes and scanning ion microscopes and relates in particular to a method for evaluating image resolution and a microscope having an evaluation function.

In charged particle microscopes such as scanning electron microscopes (SEM) and scanning ion microscopes (SIM), the related techniques for evaluating image resolution are roughly divided into two methods. One is the gap method disclosed in JP-A-45265/1993 for evaluating image resolution by viewing a microscope image of gold particles deposited by evaporation onto a carbon substrate as a specimen and then finding the minimum visually discernible gap separating the particles at two points as seen on the monitor display of the microscope.

The other is the FFT method as disclosed in JP-A-24640/1999 for evaluating image resolution by frequency analysis of observation image data that was subjected to two-dimensional Fourier transform (FFT).

SUMMARY OF THE INVENTION

The first gap method of the related art has the problem that high accuracy and repeatability of image resolution evaluation values cannot be expected because the size and shape of the gold particles to be imaged are not uniform and because the human evaluator may not be objective when visually determining the minimum gap between two particles. The second FFT method of the related art also has the problem that resolution is visually evaluated with a resolution determination curve plotted on a power spectrum graph for frequency analysis, so subjectivity on the part of the evaluator still cannot be eliminated.

In the semiconductor manufacturing process in particular, multiple microscopes are used for long periods during the work process for quality control of semiconductor devices. But image resolution is still evaluated by the methods of the related art, so the differential (instrumental error) in image resolution between microscopes and changes in resolution over time cannot be accurately controlled, causing problems making it impossible to minimize variations in device quality in the device manufacturing process.

The present invention has the object of providing an image evaluation method for objectively determining image resolution of microscope images, and a microscope having a resolution evaluation function.

To achieve the above objects, the present invention provides an image evaluation method for evaluating image resolution, wherein the resolution in partial regions of the image is obtained over an entire area or a portion of the image, averaging is performed over an entire area or a portion of the image, and the averaged value becomes the resolution evaluation value for an entire area or a portion of the image. Other objects and examples of the present invention are described in the detailed description of the preferred embodiments.

BRIEF DESCRIPTION OF THE DRAWINGS

FIGS. 2A and 2B show microscope images of a gold-evaporated specimen used for resolution evaluation;

FIGS. 3A and 3B show the noise elimination effects of the image processing method of the present invention on SEM images;

FIG. 7 shows an example of an inspection device evaluation system;

FIG. 9 is a flow chart for calculating image resolution.

DETAILED DESCRIPTION OF THE PREFERRED EMBODIMENTS

Figure 1:
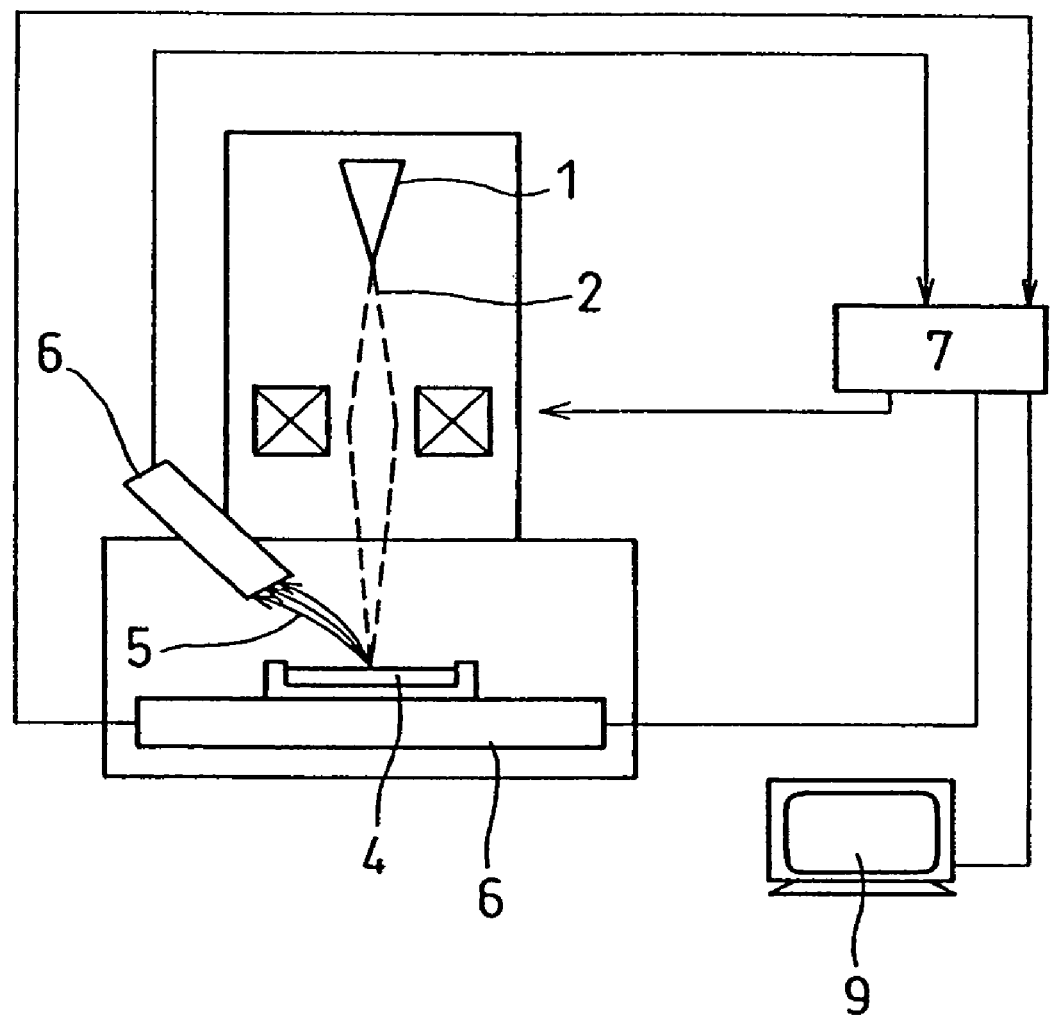
FIG. 1 is a schematic diagram of a scanning electron microscope.

Preferred embodiments of the present invention are next described in detail based on the following drawings. The outline of a scanning electron microscope (called SEM hereafter) is explained below as a preferred embodiment of the present invention. The electron lens system in FIG. 1 focuses a charged particle beam (electron beam) 2 emitted from a charged particle source (electron gun) 1 onto a specimen 4 by an electron lens 3 and scans the beam over the specimen 4 in any desired sequence. Secondary particles (secondary electrons) 5 generated from the surface of the specimen 4 by irradiation of the electron beam are detected by a secondary particle detector system 6. The output of the detector system 6 is input as image data to a control system 7 (control processor) having an image processing and control function. The specimen 4 can be moved along in any direction in the three dimensions by use of an X-Y-Z stage 8. The control system 7 also controls the charged particle source (electron gun) 1, the electron lens 3, the secondary particle detector system 6, X-Y-Z stage 8, and an image display device 9.

In this embodiment, the electron beam 2 is two-dimensionally scanned over the surface of the specimen 4 with a scanning coil (not shown in drawing). The signal detected with a secondary electron detector in the secondary particle detector system 6 is transferred to an image memory after being amplified by a signal amplifier in the control system 7 and is finally displayed as an image of the specimen on the image display device 9. The secondary signal detector may be a secondary electron or reflected electron detector, photodetector or X-ray detector.

The address signals corresponding to the memory positions in the image memory are generated in the control system 7 or a separately installed computer, and supplied to a scanning coil after being converted into analog signals. When for example, the image memory has 512×512 pixels, the X-direction address signal is a digital signal representing 0 to 512 repeatedly. The Y-direction address signal is also a digital signal representing 0 to 512 repeatedly but is incremented by 1 each time the X-direction address signal reaches 512 from 0. These digital signals are converted into analog signals.

Since the addresses in the image memory correspond to addresses of deflection signals for scanning the electron beam, a two-dimensional image in the electron beam deflection range determined by the scanning coil is stored in the image memory. The signals in the image memory can be sequentially read out in time series by a readout address generator circuit synchronized with a readout clock. The signals that were read out according to each address are converted into an analog signal and input to the image display device 9 as a brightness-modulated signal.

The image memory has a function for storing images (image data) while superimposing (synthesizing) them in order to improve the signal-to-noise ratio. For example, one complete image is created by storing images obtained with 8 two-dimensional scans while superimposing them. In other words, a final image is created by synthesizing images that were formed by one or more X-Y scans. The number of images (frame integration count) for creating one complete image can be set arbitrarily to an optimum value in view of factors such as the efficiency of generating secondary electrons. Another final image can also be created as needed by further superimposing images that were created by integrating multiple image frames. When or after the desired number of images has been stored, blanking may be performed with the primary electron beam to stop the input of information to the image memory.

When the frame integration count is set to 8, a sequence may be made so that the first image frame is deleted when the ninth image frame is input so that there are always 8 image frames. Weighted averaging can also be performed, for example, by adding the product of the image integrated in the image memory times (×) ⅞, to the ninth image when the ninth image is input.

The control system 7 has an input device (not shown in drawing) that specifies the image acquisition conditions (scanning speed, number of images to be integrated), field-of-view correction method and how images should be output or saved. In addition, the control system 7 incorporates a memory medium (not shown in drawing) for storing various types of data.

This embodiment of the present invention also provides a function that forms a line profile based on the detected secondary electrons or reflected electrons. Such a line profile should be formed based on the quantity of detected electrons when a specimen is scanned one-dimensionally or two-dimensionally with the primary electron beam, or based on the brightness information of the specimen image. A line profile obtained this way will be used, for example, to measure the dimensions of patterns formed on a semiconductor wafer.

The schematic diagram in FIG. 1 was explained with the control system 7 as an in integral or semi-integral unit of the scanning electron microscope. However, the embodiment of the present invention is not limited by this example and may have an external control processor installed separately from the scanning electron microscope to perform the processing explained below. This case will require transfer media for sending the signals detected with the secondary signal detector to the control processor or sending the signals from the control processor to the electron lens and deflector of the scanning electron microscope, and also an input/output terminal for inputting and outputting the signals sent by way of the transfer media.

Furthermore, this embodiment of the present invention also provides a function that for example, allows storing the observation conditions (measurement points, optical conditions for electron scanning microscope, etc.) in advance as a guide to help assist in viewing multiple points on a semiconductor wafer. Measurement and observation can easily be performed according to the contents of this guide.

A program intended to perform the processing explained below may be stored in the memory medium and executed with a control processor having an image memory and supplying signals necessary for the scanning electron microscope. In other words, the following embodiment of the present invention may be established as a program invention used for charged-particle beam equipment such as scanning electron microscopes with an image processor. A specimen is placed on stage 8 of this embodiment for evaluating image resolution as explained below.

Figure 8:
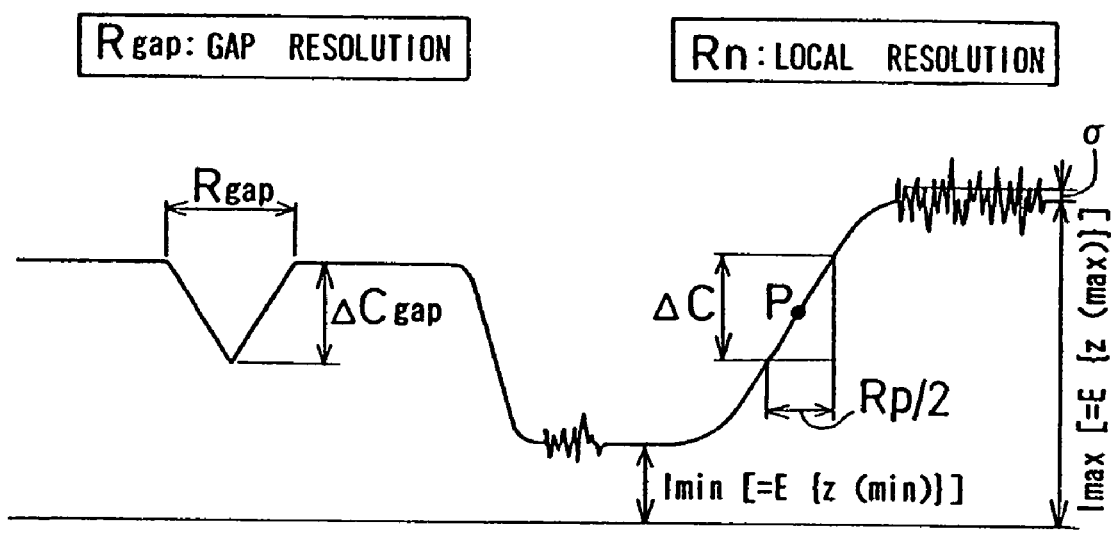
FIG. 8 is a schematic diagram showing local image resolution.

Particles of gold having a large atomic number are typically deposited by evaporation on a carbon substrate and used as a specimen for evaluating image resolution. FIGS. 2A and 2B show SEM images of typical gold particle specimens. These are digital images consisting of 512×512 pixels. Image resolution is calculated by the evaluation algorithm explained below. The concept for evaluating image resolution is shown in FIG. 8 along with the gap resolution evaluation method, and the flow chart for calculating image resolution is shown in FIG. 9. A detailed description is given in the following embodiments.

First Embodiment

In the present embodiment, a microscope image is treated as an image of a three-dimensional object viewed from one direction, and the gradient and curvature of the object surface at each pixel point P are first obtained. Next, the hypothetical shortest distance required for the object to be distinguished from the surrounding area, or in other words, the local resolution is calculated from the gradient and the minimum contrast needed to recognize the object. The weighted harmonic mean of the local resolution is then calculated over the entire image, and the mean value is viewed as a typical resolution of the image. A specific example for calculating image resolution is explained below using the flow chart shown in FIG. 9.

A microscope image is treated as an image of a three-dimensional object viewed in one direction and the geometrical features such as the gradient and radius of curvature of the object shape are calculated by range image analysis. The image is a digital image consisting of n×n pixels. The position of a pixel at an arbitrary point on the image is considered as (x, y), and the density at the pixel as "z". To calculate the gradient and radius of curvature of the object shape at point P(x, y), a local region (partial region) comprised of m×m pixels (normally, m=5) with the center at point P is clipped out and the shape of the local surface is approximated by multi-degree equation z(x, y). Here, a quadratic equation is used as a multi-degree equation for approximating with a curved surface, as expressed in the quadratic equation (Eq. 1) below.

$$z(x,y)=ax^2+by^2+cxy+dx+ey+f \quad \text{(Eq. 1)}$$

To obtain a fitting or matching with the curved surface, the coefficients "a" to "f" are determined so that the sum-square value of the fitting error is minimal. Once these coefficients are determined, the gradient g(x, y; θ) [θ is azimuth angle of gradient] of the local surface can be found by the following geometrical calculation (Eq. 2).

$$g(x,y;\theta)=\{(\delta z/\delta x)^2+(\delta z/\delta y)^2\}^{1/2} \quad \text{(Eq. 2a)}$$

$$\theta=\arctan\{(\delta z/\delta y)/(\delta z/\delta x)\} \quad \text{(Eq. 2b)}$$

The radius of curvature, Rc, can also be similarly computed. Applying this approximated curved surface is also effective in eliminating the noise of the image. More specifically, by clipping out a part of an image containing noise and approximating it with a curved surface or plane, the noise can be partially eliminated, allowing calculation of the gradient with fewer adverse effects from noise.

In view of the noise elimination effect and reduction in calculation time, a local region of a 5×5 pixel size (m=5) is preferable and a quadratic equation is suitable for this size. When a local region of a 3×3 pixel size (m=3) is used, the calculation time becomes shorter, but the effect achieved from eliminating the frequency component noise, especially noise exceeding a period of 3 pixels on the image pattern will be poor compared to cases using the quadratic equation of m=5. On the other hand, the 3×3 pixel size was used as the local region size for images having less noise and containing a large quantity of frequency components having a period of less than 5 pixels on the image pattern because the gradient calculation accuracy is better. When applying a plane (display functional equation is linear) as the approximate surface instead of the curved surface, the calculation time becomes shorter but the noise elimination effect is poor compared to cases using the curved surface for the quadratic equation display.

Here, an azimuth angle representing the range from a specific azimuth angle $\theta_i-\pi/n$ to $\theta_i+\pi/n$ is expressed as $\theta_i$ (i=1, 2, ..., n; n=36), and the resolution obtained by finding a harmonic mean in the image while weighting with the weight Wp of the local image resolution Rp having the azimuth angle, is viewed as the azimuth image resolution $R(\theta_i)$. The image resolution R over the entire image is obtained by finding the geometric mean of this azimuth image resolution $R(\theta_i)$ by using the whole azimuth angle. The image resolution calculated this way is not greatly affected even, for example, if unexpected noise intrudes into a portion of the microscope image.

$$1/R(\theta_i)=[\int\{Wp(x,y)/Rp(x,y;\theta_i)\}dxdy]/[\int Wp(x,y)dxdy] \quad \text{(Eq. 3a)}$$

$$Rp(x,y;\theta_i)=2\Delta C/|g(x,y;\theta_i)| \quad \text{(Eq. 3b)}$$

$$R=\{R(\theta_1),R(\theta_2),\ldots,R(\theta_n)\}^{1/n} \quad \text{(Eq. 4)}$$

Here, $\Delta C$ is the threshold contrast needed to discern a gap on the object shape that corresponds to the resolution, and is proportional to the maximum amplitude of the expected density value $E\{z\}$ calculated from Eq. 1. When the proportional coefficient is considered as Kc, $\Delta C$ is given as follows (normally, Kc=0.1).

$$\Delta C=Kc\cdot[E\{z(\max)\}-E\{z(\min)\}] \quad \text{(Eq. 5)}$$

The local weight Wp can be considered as the gradient g only (Eq. 6a) or the product (Eq. 6b) of g times $[E\{z(x,y)\}-E\{z(\min)\}]$. The latter is used when evaluating an image in which the gradient, g, is large and more attention should be paid to bright portions. This greatly relieves the effects of brightness on the resolution when brightness is changed.

$$Wp(x,y)=|g(x,y)| \quad \text{(Eq. 6a)}$$

$$[E\{z(x,y)\}-E\{z(\min)\}]\cdot|g(x,y)| \quad \text{(Eq. 6b)}$$

Here, one way to calculate the local resolution with high accuracy when the applied surface is a curved surface is by calculating the Wp (Eq. 6) limited to cases where assuming that ½ of that value (=Rp/2) is less than the absolute value of the minimum radius of the curvature, and setting Wp=0 in all other cases. The standard deviation σ of density (corresponding to image noise) which is a parameter for evaluating image quality can also be calculated by using the local noise $\sigma_p$.

$$\sigma=\{1/(n-2)\}\{\Sigma(\sigma_p^2)\}^{1/2}(m=5) \quad \text{(Eq. 7a)}$$

$$\sigma_p=\{1/m)\}\{\Sigma[z(x,y)-E\{z(x,y)\}]^2\}^{1/2} \quad \text{(Eq. 7b)}$$

The embodiment of the present resolution evaluation method is explained using FIGS. 2A and 2B. Shown in FIG. 2A and FIG. 2B are images (512×512 pixels) of a specimen prepared for resolution evaluation, photographed with an SEM under different optical conditions. Image resolution Rcg by the present evaluation method and image resolution Rgap by the gap method of the related art are shown by the resolution ratio between the conditions A and B, along with evaluation errors caused by multiple human evaluators.

In either resolution, the R(b)/R(a) ratio is larger than 1, but the gap method of the related art shows an error due to multiple evaluators, which is as large as ±50%. However, the error occurring in the present evaluation method is 0 as long as the same image data is used.

The resolution evaluation algorithm stated above determines all parameters required for calculation by using only the information possessed by the image. The present evaluation method uses an algorithm that is not vulnerable to subjective impressions of human evaluators and has the following advantages:

(1) Subjectivity of the evaluator accompanying the conventional gap method of resolution evaluation can be eliminated, so images can be objectively evaluated.
(2) Calculation is performed on real space so that calculation parameters are easy to understand as a physical quantity. (Calculation is performed on frequency space by the FFT method.)
(3) Not only resolution but also the standard deviation of density (image noise) can be calculated and evaluated.
(4) Signal-to-noise ratio, image quality, viewing magnification accuracy (or error) can be calculated and evaluated.
(5) Not susceptible to changes in brightness and image noise.
(6) Applicable to specimens with a high directional pattern (Not possible with the FFT method). Not susceptible to effects occurring from contamination on the specimen.
(7) Resolution can be evaluated among multiple microscopes based on the same specimen (image), allowing the instrumental error (differential between microscopes) to be easily found.

In particular, advantage (1) allows objective comparison of image resolution between microscopes of the same type and is very helpful to the users when selecting the microscope model. The present embodiment was explained as an example for obtaining image resolution over the entire specimen image, but preferred embodiments are not limited to it. Resolution in a specific region of the specimen image (smaller than the entire image but larger than a local region used for calculating the local resolution Rp) may also be calculated. For instance, an image region selecting device (pointing device, etc.) not shown in the drawing may be connected to the control system 7 to select any desired size at any position on the image, so that image resolution in a region corresponding to the selected image is computed. This method eliminates background information not directly relating to the measurement object and acquires actual image resolution in the region to be measured. In addition, the throughput for calculating image resolution can be improved since the calculation is performed only on a specific region.

Second Embodiment

As the second embodiment, a scanning electron microscope (SEM) utilizing the present image evaluation method is explained below. The scanning electron microscope is just one example, so the present image evaluation method can be applied to most inspection devices in which images must be accurately evaluated.

On a semiconductor device production line, as shown in FIG. 7, multiple SEMs 701 to 704 are connected by a network to the master computer 705 for measuring and controlling the length of semiconductor device patterns.

Each SEM has an image resolution computing function based on the above image resolution evaluation method, which is installed in the computer of the SEM control system. Self-evaluation of image resolution can be implemented by an instruction from the equipment operator. The resolution evaluation value appears on the monitor that also displays the microscope image.

On the SEMs that have been used to measure and control the length of device patterns for extended periods of time, image resolution of each SEM is periodically evaluated by using the specimen for image resolution evaluation, displayed and recorded, along with the information on changes in the evaluation value. These periodically evaluated resolution values are stored in the master computer 705 where the data is collectively managed together with the information from other SEMs. If an image resolution evaluation value falls outside the allowable range or value, the operator is informed of the error on that microscope and master computer. The master computer 705 has an image display monitor and an image processor as explained earlier. The display monitor shows that the image resolution evaluation value is outside the allowable range or value. As specific display formats, information on changes in evaluation values on multiple SEMs may be graphically represented while distinguishing the allowable range from the area outside it. In another possible format, illustrations of multiple SEM models may be displayed on the monitor as shown in FIG. 7 and the illustration of the model on the display may start flashing if its evaluation value falls outside the allowable range or value. Using these display formats prevents the measurement accuracy from deteriorating even if a measurement error occurs due to a differential occurring between microscopes (instrumental error). In this embodiment, if the output image from an inspection device indicates a resolution evaluation value outside the allowable range, the error is displayed or stored in memory so that the instrumental error between each inspection device can be controlled while maintaining high resolution.

On the microscope where the error occurred, a command for adjusting the optical system which is one inspection parameter is issued by an instruction from the operator or from the program installed in the control system. The lens system is then controlled by the signal based on the evaluation value through the control system of the microscope, so that the image resolution is set within the specified allowable range. Information on the adjustment process is stored in the SEM that caused the error and also sent to the master computer. In this example, each SEM evaluated its own image resolution; however the master computer for system control may evaluate the resolution of images sent from each SEM and send the evaluation value signal back to each SEM. Based on this evaluation value signal, each SEM controls the lens system through the control system of the microscope in the same way as described above in order to set the image resolution within the specified allowable range.

In this way, differences in resolution occurring among multiple SEMs can be simultaneously measured and controlled. If an error is found, the above method is used to make an adjustment. This reduces differences in device quality between each production process and maintains uniform quality. Uniform quality in device production can also be maintained in the same way among factories in different locations by communicating this information.

Third Embodiment

Figure 4:
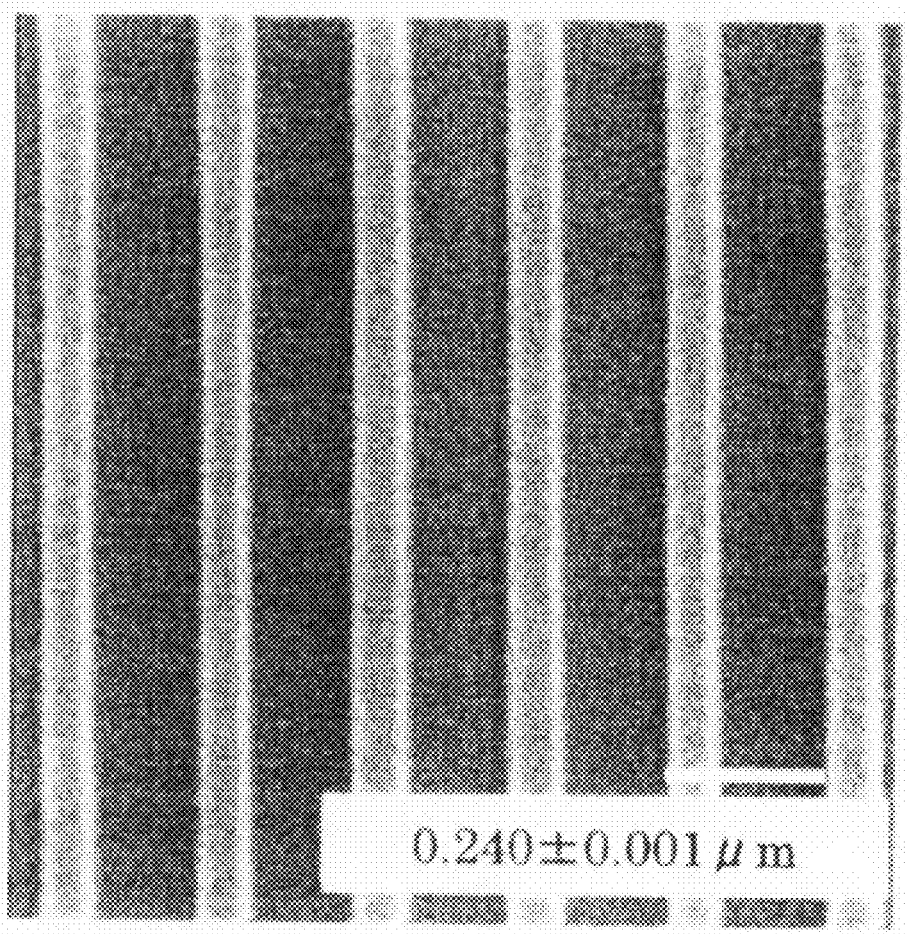
FIG. 4 shows an SEM image of a dimensional calibration specimen (pitch dimension: 0.240±0.001 μm)

An embodiment is next described in detail using the previously described image resolution evaluation specimen. In this embodiment, a dimensional calibration specimen (JP-A-31363/1996) was used as an image resolution evaluation specimen having an absolute dimensional pattern. FIG. 4 shows an SEM image of this calibration specimen. The pitch dimension of the grid pattern formed on a silicon substrate is an extremely accurate 0.240±0.001 μm.

Using this specimen allows highly accurate magnification calibration of SEM images. This means that pixels used as size units for microscope digital images can now be converted into or converted from actual dimensional units (for example, nanometers) with high accuracy, allowing the resolution evaluation value R in the present invention to be displayed in length units (for example, nanometers). However, because the pattern of the specimen used here consists of vertical lines, the image resolution is not calculated from the average in all azimuth directions, but instead uses the image resolution in an azimuth direction (horizontal direction in the case of FIG. 4) showing a minimum value among azimuth image resolution values calculated from Eq. 3a.

The resolution evaluation value R is convenient during actual use because it is displayed in units of actual dimensions (length) that do not depend on the viewing magnification. In pixel unit display on the other hand, a specified number of pixels is allocated to the image resolution value, making it convenient to directly calculate the optimum viewing magnification. In an image resolution display, length units are usually used, but the pixel unit or both units can also be simultaneously displayed at the discretion of the equipment operator. By presetting the number of pixels to be allocated for image resolution, the viewing magnification can be automatically set for various specimens.

Image resolution and signal-to-noise ratio (SNR) are parameters used for evaluating image quality of a microscope images. When the average of the expected density value $E\{z\}$ is Zav, the signal S can be approximated as $S=Zav-E\{z(min)\}$, and the noise N can be approximated as $N=\sigma$. (See Eq. 7.), the SNR can then be obtained as follows.

$$SNR=[Zav-E\{z(min)\}]/\sigma \qquad \text{(Eq. 8)}$$

If the fine structure pattern is the focus of the image quality parameter, and C is utilized as the maximum amount of information (bit units) per pixel in that structure pattern, then C can be calculated from the following equation using the image resolution value R of pixel units.

$$C=\{\log_2(1+SNR)\}/R^2 \qquad \text{(Eq. 9)}$$

The image can therefore now be evaluated in terms of image resolution, noise, and image quality. By setting a threshold level for at least one of these evaluation parameters to determine whether the image is a pass (acceptable) or a fail (reject), the image that was obtained can be judged as acceptable or a reject based on these pass/fail parameters as well as each evaluation value.

The image display device displays different messages according to the evaluation value and pass/fail results (for example, whether the threshold level is exceeded, to what extent the threshold level was exceeded, etc.). The messages to be displayed can also be selected by the equipment operator. The messages may be stored in the control processor memory for readout later on.

Fourth Embodiment

The viewing magnification accuracy (or error) is discussed next. The image resolution evaluation value (unit: μm) of a microscope image taken with a dimensional calibration specimen under a particular viewing magnification is considered as R, the absolute pitch dimension of the dimensional calibration specimen as L, and the error as Δx (units: μm). The dimensional calibration specimen has dimensions of L=0.240 μm and Δx=0.001 μm in this example. On the surface of this specimen, a repetitive pattern having a square-wave cross section is fabricated by silicon anisotropic etching. Each square-wave edge sharply rises perpendicular to the specimen surface.

After correcting the image rotation so that the grid pattern image of the dimensional calibration specimen is vertical on the display monitor, the viewing magnification is calibrated while measuring the pitch dimension at multiple points (about 10 to 20 points) at a magnification of 5 to 100,000, so that the average is 0.240 μm. In other words, the scan area of the electron beam is changed so that the measured average value approaches 0.240 μm. The pitch dimensions of the pattern itself have an error of a few nanometers so the measurements made at these multiple points are averaged to reduce the error. At this point, the magnification error E and magnification accuracy P on the percentage (%) display are calculated as follows.

$$E=100\times\{(\Delta x)^2+R^2\}^{1/2}/L \qquad (Eq.\ 10)$$

$$P=100-E \qquad (Eq.\ 11)$$

Verification using general scanning electron microscopes confirmed that respective viewing magnification errors E within ±2% and ±0.5% were obtained. These results prove that, like image resolution, the viewing magnification accuracy and error can be controlled with high accuracy versus microscope differentials (instrumental error) and changes over time not only for an individual microscope but also for multiple microscopes.

Figure 5:
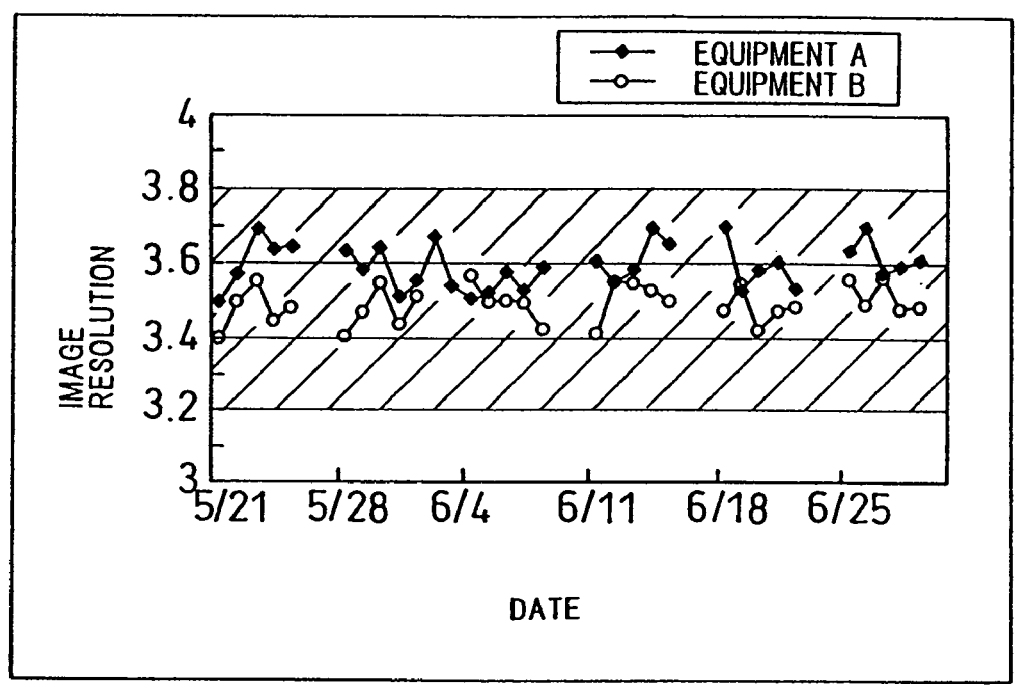
FIG. 5 shows changes over time in image resolution over one month, displayed on the monitor display of SEM equipment A and B.

Changes in data over elapsed time on these evaluation parameters can also be displayed as needed on the image display device in a graphic or spreadsheet format by an instruction from the equipment operator. FIG. 5 shows typical graphical changes in the image resolution over one month, displayed on the image display monitor of SEM equipment A and B. The figure clearly shows that image resolutions on both units of equipment are held within the range between 3.2 and 3.8. If the resolution deviates from this range, the equipment should be serviced. This graph also proves that due to an instrument error the resolution of equipment B is 0.1 better than equipment A, even though the image resolutions of both pieces of equipment are within the allowable range. Based on this instrument error, a coefficient for correcting the instrumental error between the two units of equipment is found and used to correct the measurement length value. As a result, semiconductor device production can now be controlled while the instrument error between the microscopes is minimized.

Figure 6A:
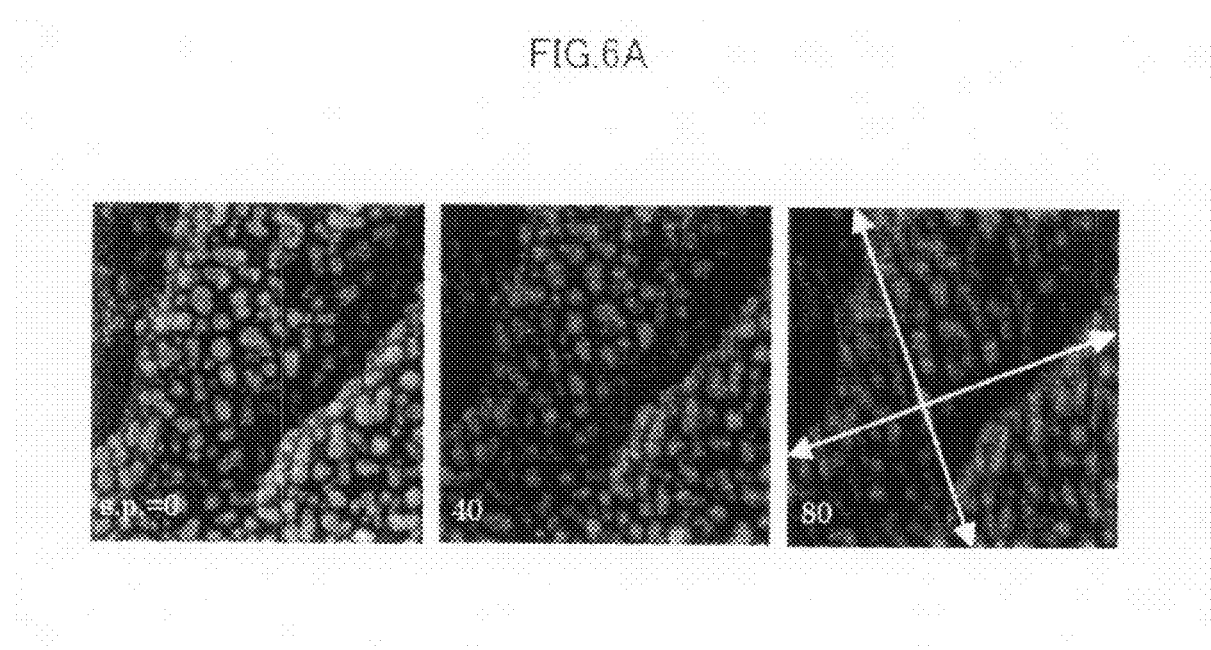
FIGS. 6A and 6B illustrate an evaluation example of astigmatic images using azimuth resolution.
Figure 6B:
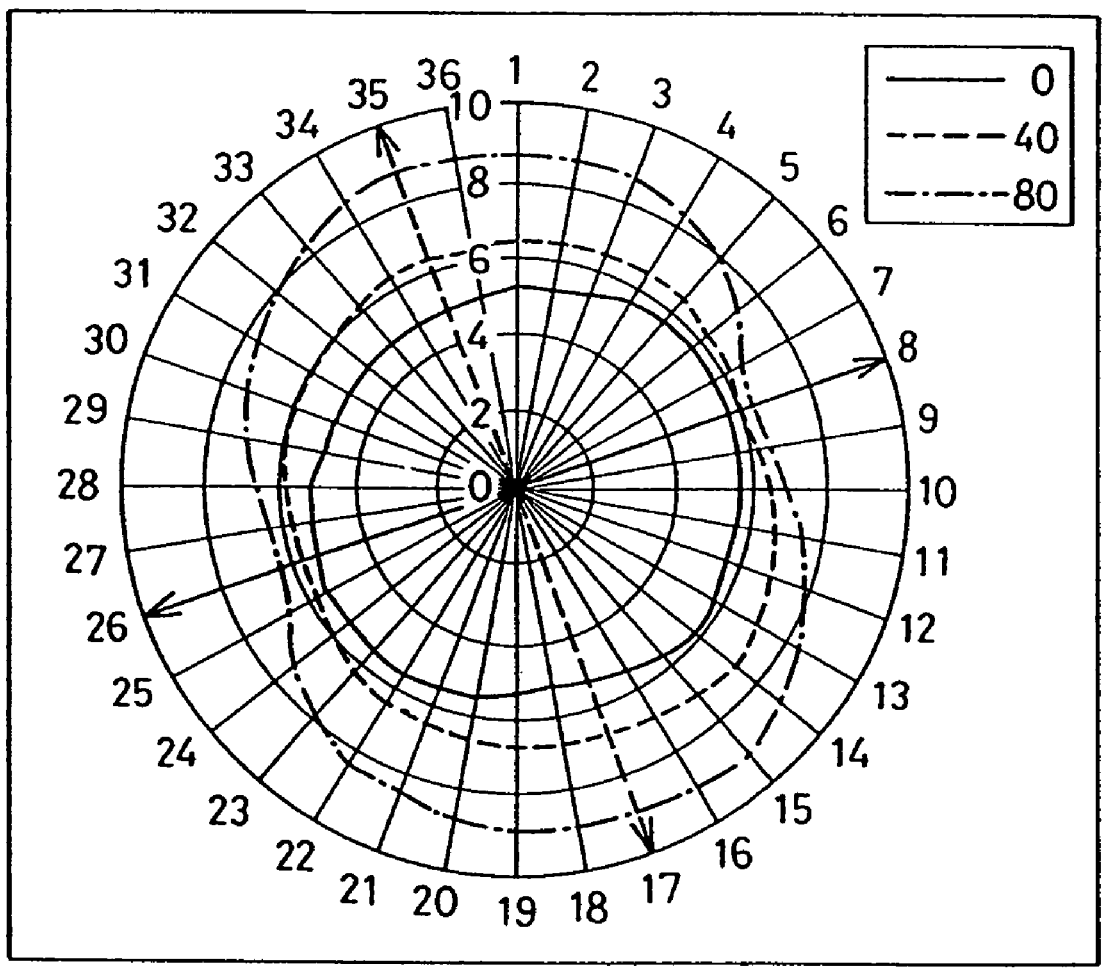

FIGS. 6A and 6B show an example of evaluation of astigmatic images using azimuth resolution. FIG. 6A shows microscope images of gold particles with correction parameter s.p. values at 0, 40 and 80 hours on the astigmatic image control system installed in the microscope control system 7. Azimuth image resolutions at this point are plotted on a polar coordinate in FIG. 6B. The azimuth image resolution curve is nearly circular at s.p.=0, but increases at azimuths of 17 and 35 (direction of arrow) as the s.p. value increases to 40 and then 80, while exhibiting little change at azimuths of 8 and 26 (direction of arrow). These changes indicate the extent of image blur in FIG. 6A. This image blur corresponds to the beam spread in the microscope. (See the image at s.p.=80 in FIG. 6A.) A microscope capable of automatically performing focus adjustment and astigmatic correction with high accuracy can be achieved by installing in the computer in the control system 7, a program combining the azimuth image resolution evaluation method with the optimization method to minimize evaluation values in all azimuth directions.

The above embodiment was explained using SEM, but similar effects were attained from a scanning transmission electron microscope (STEM) and scanning ion microscope (SIM). In the STEM, the specimens are thin films and the brightness signals used for image construction are secondary electrons, primary electrons transmitting through the specimen, or X-rays emitted by excitation of primary electrons. In the case of SIM, since spattering damage occurs on the specimen surface from ion beams which are not used by the SEM or STEM, the same point on the specimen cannot be observed at high magnification. Therefore, because the present evaluation method is "applicable to specimens with a high directional pattern" mentioned as the advantage (5) earlier, a wider range of specimens can now be used for resolution evaluation. The present evaluation method has proven very effective in improving the operability and the accuracy of image resolution during actual use.

The above embodiments were explained using microscopes as the device of the embodiment. However, the image resolution evaluation method of the present invention can also be used in equipment utilizing microscope images for beam positioning and setting the beam irradiation area, for example of charged-particle beam systems such as focused ion beam machining systems, electron beam diagnostic equipment, electron beam exposure systems. Therefore, the "microscopes" mentioned here include "charged-particle beam systems" utilizing microscope images.

The present invention uses a technique by which a microscope image is treated as an image of a three-dimensional object viewed from one direction and is approximated to a curved surface (or plane) described with a multi-order (or linear) function z=f(x, y) for each local region. This technique is also very effective as an image processing method for reducing image noise. The density distribution after image processing is definitely the E{z(x, y)} distribution of Eq. 7. FIGS. 3A and 3B show the image processing effects on SEM images of a resolution standard specimen. FIG. 3A is the original image and FIG. 3B is the processed image. The image of FIG. 3B appears smooth because of the noise elimination effect.

The present invention can be applied not only to SEM and SIM but also to any microscope using the gap method and FFT method of the related art as the image resolution evaluation method, for example, optical microscopes, and scanning probe microscopes. Likewise, the image processing method of the present invention has the effect of eliminating noise on all microscope images as well as SEM and SIM.

The microscope image resolution evaluation process of the present invention is further not susceptible to the subjective impressions of the evaluators, so image resolution evaluation values can be obtained with high reliability and repeatability.

In the image resolution evaluation method using a magnification calibration specimen, optical characteristics are precisely adjusted by making use of the evaluation value signal so that the desired image resolution, magnification, image noise and image quality can be maintained and controlled with a high degree of accuracy.

Furthermore, when the present invention is applied to multiple microscopes used for quality control in semiconductor device production, the differential (instrumental error) in image resolution between each microscope and changes in resolution over time can be accurately controlled, making it possible to minimize variations or irregularities in device quality during the device manufacturing process.

What is claimed is:

1. An inspection device evaluation system connected to a plurality of inspection devices via a network for evaluating images obtained by these inspection devices, wherein the inspection device evaluation system evaluates the image resolution of the images obtained by the plurality of inspection devices, wherein, upon failure of an evaluation value meeting a predetermined allowable value or set value, an instruction is issued to adjust the inspection conditions of the inspection devices so as to bring the image resolution into conformity with the predetermined allowable value or set value, wherein the evaluation of the image resolution of the images comprises calculating the resolution of a plurality of partial regions in which a plurality of pixels are arranged in a matrix, and averaging the image resolutions of the plurality of partial regions thus calculated.

2. The inspection device evaluation system according to claim 1, wherein the inspection device evaluation system calculates the resolution of the partial regions based on the density gradient of the partial regions of the image.

3. The inspection device evaluation system according to claim 1, wherein the inspection device evaluation system calculates the resolution evaluation value periodically, and displays or stores the thus calculated resolution evaluation value together with time transition information.

4. The inspection device evaluation system according to claim 1, wherein the inspection device evaluation system calculates, along with the resolution, image noise of the image, an S/N ratio of the image, or at least one of image quality evaluation parameters calculated based on the resolution.

5. The inspection device evaluation system according to claim 1, wherein the inspection device evaluation system comprises the function of setting a threshold value for the resolution evaluation value, image noise, S/N ratio of the image, or an at least one of image quality evaluation parameters, wherein, upon the resolution, image noise, S/N ratio of the image, or the image evaluation parameter exceeding the threshold value, a relevant indication is displayed on a display unit or stored.

6. The inspection device evaluation system according to claim 1, wherein the inspection device evaluation system evaluates the resolution evaluation value, image noise, S/N ratio of the image, or an at least one of the image evaluation parameters periodically to generate an image evaluation value, and displays or stores the image evaluation value together with time transition information.

7. The inspection device evaluation system according to claim 1, wherein the inspection device evaluation system controls a display unit to display magnification accuracy or magnification error.

8. The inspection device evaluation system according to claim 1, wherein the unit of the resolution evaluation value is length.

9. The inspection device evaluation system according to claim 1, wherein the inspection device evaluation system determines a local resolution based on the density gradient in each of the partial regions, and performs weighted averaging over the entire image or a portion of the image.

10. The inspection device evaluation system according to claim 9, wherein the inspection device evaluation system allocates a curved surface or a plane of a multi-order or linear function $z=f(x, y)$ to each of the partial regions, where z is the density of the image and (x, y) is the position of an arbitrary partial region within the image, wherein the control processor determines the density gradient based on a differential value of the function.

11. An inspection device evaluation system connected to a plurality of inspection devices via a network for evaluating images obtained by these inspection devices, wherein the inspection device evaluation system evaluates the image resolution of the images obtained by the plurality of inspection devices, wherein, upon failure of an evaluation value meeting a predetermined allowable value or set value, the system comprising a display unit for displaying a relevant indication, wherein the evaluation of the image resolution of the images comprises calculating the resolution of a plurality of partial regions in which a plurality of pixels are arranged in a matrix, and averaging the image resolutions of the plurality of partial regions thus calculated.

12. The inspection device evaluation system according to claim 11, wherein the inspection device evaluation system calculates the resolution of the partial regions based on the density gradient of the partial regions of the image.

13. The inspection device evaluation system according to claim 11, wherein the inspection device evaluation system calculates the resolution evaluation value periodically, and displays or stores the thus calculated resolution evaluation value together with time transition information.

14. The inspection device evaluation system according to claim 11, wherein the inspection device evaluation system calculates, along with the resolution, image noise of the image, an S/N ratio of the image, or at least one of image quality evaluation parameters calculated based on the resolution.

15. The inspection device evaluation system according to claim 11, wherein the inspection device evaluation system comprises the function of setting a threshold value for the resolution evaluation value, image noise, S/N ratio of the image, or an at least one of image quality evaluation parameters, wherein, upon the resolution, image noise, S/N ratio of the image, or the image evaluation parameter exceeding the threshold value, a relevant indication is displayed on a display unit or stored.

16. The inspection device evaluation system according to claim 11, wherein the inspection device evaluation system evaluates the resolution evaluation value, image noise, S/N ratio of the image, or an at least one of the image evaluation parameters periodically to generate an image evaluation value, and displays or stores the image evaluation value together with time transition information.

17. The inspection device evaluation system according to claim 11, wherein the inspection device evaluation system controls a display unit to display magnification accuracy or magnification error.

18. The inspection device evaluation system according to claim 11, wherein the unit of the resolution evaluation value is length.

19. The inspection device evaluation system according to claim 11, wherein the inspection device evaluation system determines a local resolution based on the density gradient in each of the partial regions, and performs weighted averaging over the entire image or a portion of the image.

20. The inspection device evaluation system according to claim 19, wherein the inspection device evaluation system allocates a curved surface or a plane of a multi-order or linear function z=f(x, y) to each of the partial regions, where z is the density of the image and (x, y) is the position of an arbitrary partial region within the image, wherein the control processor determines the density gradient based on a differential value of the function.

* * * * *